United States Patent
Wei et al.

(10) Patent No.: US 9,935,595 B2
(45) Date of Patent: Apr. 3, 2018

(54) SWITCH CONTROL METHOD, SWITCH CONTROL CIRCUIT, REGULATOR AND STORAGE MEDIUM

(71) Applicant: SANECHIPS TECHNOLOGY CO., LTD., Shenzhen (CN)

(72) Inventors: Dong Wei, Guangdong (CN); Weisheng Geng, Guangdong (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/306,340

(22) PCT Filed: Oct. 8, 2014

(86) PCT No.: PCT/CN2014/088154
§ 371 (c)(1),
(2) Date: Oct. 24, 2016

(87) PCT Pub. No.: WO2015/161626
PCT Pub. Date: Oct. 29, 2015

(65) Prior Publication Data
US 2017/0047902 A1    Feb. 16, 2017

(30) Foreign Application Priority Data

Apr. 25, 2014    (CN) .......................... 2014 1 0172812

(51) Int. Cl.
*H03F 3/217*    (2006.01)
*H02M 3/155*    (2006.01)
(Continued)

(52) U.S. Cl.
CPC ............ *H03F 3/2171* (2013.01); *H02M 1/14* (2013.01); *H02M 3/155* (2013.01);
(Continued)

(58) Field of Classification Search
CPC .......... H03F 3/2171; H03F 1/02; H03F 1/303; H03F 3/005; H03F 3/2178; H03F 1/0277; H03F 3/72; H02M 3/155; H03G 1/0088
(Continued)

(56) References Cited

U.S. PATENT DOCUMENTS 6,087,897 A * 7/2000 Wang .................. H03F 3/45479
327/124
7,116,161 B2 * 10/2006 Nakahira .............. H03F 3/4521
327/124
(Continued)

FOREIGN PATENT DOCUMENTS

| CN | 101662211 A | 3/2010 |
|---|---|---|
| CN | 102545597 A | 7/2012 |
| JP | 5243292 B2 | 7/2013 |

OTHER PUBLICATIONS

International Search Report for Application No. PCT/CN2014/088154, dated Dec. 30, 2014.

*Primary Examiner* — Khanh V Nguyen
(74) *Attorney, Agent, or Firm* — Marshall, Gerstein & Borun LLP

(57) ABSTRACT

Disclosed is a switch control circuit, including an error amplifier, a compensation network and a control circuit, wherein the compensation network is connected to an output end of the error amplifier; and the control circuit includes switches from a first switch to a fifth switch and is configured to control operating states of the error amplifier and the compensation network by controlling on/off states of switches from the first switch to the fifth switch. Further disclosed are switch control method, a regulator including the above switch control circuit as well as a computer storage medium.

10 Claims, 4 Drawing Sheets

(51) Int. Cl.
  *H02M 1/14* (2006.01)
  *H03F 1/30* (2006.01)
  *H03F 3/00* (2006.01)
  *H02M 1/00* (2006.01)

(52) U.S. Cl.
  CPC ..... *H02M 2001/0025* (2013.01); *H03F 1/303* (2013.01); *H03F 3/005* (2013.01); *H03F 3/2178* (2013.01); *H03F 2200/351* (2013.01); *H03F 2200/78* (2013.01)

(58) Field of Classification Search
  USPC ....................................................... 330/9, 51
  See application file for complete search history.

(56) References Cited

U.S. PATENT DOCUMENTS

| | | | | |
|---|---|---|---|---|
| 7,535,302 | B2* | 5/2009 | Nishimura | H03F 3/3022 330/255 |
| 7,683,706 | B2* | 3/2010 | Jeon | H03F 3/005 327/554 |
| 7,795,959 | B2* | 9/2010 | Chen | H03F 3/005 330/310 |
| 7,795,961 | B2* | 9/2010 | Kojima | G09G 3/20 330/255 |
| 7,880,538 | B2* | 2/2011 | Sharma | H03F 3/005 330/9 |
| 7,944,288 | B2* | 5/2011 | Ummelmann | G01R 19/0023 330/109 |
| 7,956,589 | B1 | 6/2011 | Fan | |

* cited by examiner

SWITCH CONTROL METHOD, SWITCH CONTROL CIRCUIT, REGULATOR AND STORAGE MEDIUM

TECHNICAL FIELD

The present disclosure relates to circuit control technologies and in particular relates to a switch control method, a switch control circuit, a regulator and a computer storage medium.

BACKGROUND

An error amplifier is a core part of a voltage control loop in a step-down conversion circuit (BUCK circuit), and stability of the whole BUCK circuit is directly influenced by an operating mode of the error amplifier. FIG. 1 is a schematic diagram illustrating a composition structure of the BUCK circuit. As shown in FIG. 1, in the voltage control loop, an inverted input end of the error amplifier is connected with an output sampling voltage $V_{FB}$, and an in-phase input end of the error amplifier is connected with a reference voltage $V_{REF}$. When the BUCK circuit operates in a Pulse Width Modulation (PWM) mode, an output voltage $V_c$ of the error amplifier and sawtooth waves are mutually compared, and a state of a setting end of an SR latch is influenced by virtue of a PWM voltage comparator, so that an aim of changing a duty cycle of switching is achieved, and finally an output voltage of the circuit is stabilized.

A circuit is mutually switched between a Pulse Skip Modulation (PSM) mode and the PWM mode by virtue of a PWM_PSM control circuit under the condition that the BUCK circuit is in a light load mode. In order to reduce power consumption, the error amplifier is closed in the PSM mode by utilizing an enable signal PWM-PSM, so that the output end of the error amplifier is set at an very low level, and therefore, the output voltage of the circuit continuously drops and great and indeterminable ripples are caused due to an extremely small switching duty cycle when the BUCK circuit is switched from the PSM mode to the PWM mode. The loaded output voltage is gradually reduced if the error amplifier is not closed in the PSM mode, so that the output voltage of the error amplifier continuously rises, and therefore, an output level of the error amplifier is very high when the BUCK circuit is switched from the PSM mode to the PWM mode, and great ripples are caused when the output voltage is regulated by PWM. FIG. 2 is an oscillogram illustrating a circuit output voltage $V_{out}$ and partial operating points of the error amplifier in the existing BUCK circuit during operating.

Accordingly, the output voltage of the circuit would generate great ripples in case of a light load when the BUCK circuit is mutually switched between the PSM mode and the PWM mode if a control circuit of the error amplifier and a compensation network cannot be well designed.

SUMMARY

In order to solve existing technical problems, embodiments of the present disclosure are expected to provide a switch control method and switch control circuit based on an error amplifier as well as a regulator and a computer storage medium, so that the error amplifier and the compensation network can be effectively controlled during mutual switching of a PSM mode and a PWM mode, and ripples of an output voltage of the circuit are effectively reduced.

The technical solution of the present disclosure is implemented as follows.

Embodiments of the present disclosure provide a switch control circuit including an error amplifier, a compensation network and a control circuit, where the compensation network is connected to an output end of the error amplifier; and the control circuit includes switches from a first switch to a fifth switch and is configured to control operating states of the error amplifier and the compensation network by controlling on/off states of switches from the first switch to the fifth switch.

In the above solution, the control circuit controls on/off states of switches from the first switch to the fifth switch by virtue of a same enable signal; the compensation network includes a resistor and a capacitor;

the control circuit controls the first switch and a second switch to be in a closed state, and when switches from a third switch to the fifth switch are in an off state, the error amplifier operates in an amplification state, and the compensation network operates in a mutual compensation state of resistor and capacitor; and the control circuit controls the first switch and the second switch to be in an off state, and when switches from the third switch to the fifth switch are in a closed state, the error amplifier operates in a voltage following state, and the compensation network operates in a capacitance self-compensation state.

In the above solution, switches from the first switch to the fifth switch adopt one of P-channel Metal Oxide Semiconductor PMOS, N-channel Metal Oxide Semiconductor NMOS and a triode.

In the above solution, when switches from the first switch to the fifth switch adopt the PMOS or NMOS, one of a source and a drain of the first switch is connected with an output sampling voltage, and the other of the source and the drain of the first switch is connected with an inverted input end of the error amplifier; one of a source and a drain of the second switch is connected with a reference voltage, and the other of the source and the drain of the second switch is connected with an in-phase input end of the error amplifier; one of a source and a drain of the third switch is connected with a circuit output voltage, and the other of the source and the drain of the third switch is connected with the in-phase input end of the error amplifier; one of a source and a drain of the fourth switch is connected with the inverted input end of the error amplifier, and the other of the source and the drain of the fourth switch is connected with the output end of the error amplifier; and a source and a drain of the fifth switch are respectively connected with two ends of a resistor in the compensation network.

In the above solution, when the first switch and the fifth switch adopt the triode, one of an emitter and a collector of the first switch is connected with the output sampling voltage, and the other of the emitter and the collector of the first switch is connected with the inverted input end of the error amplifier; one of an emitter and a collector of the second switch is connected with the reference voltage, and the other of the emitter and the collector of the second switch is connected with the in-phase input end of the error amplifier; one of an emitter and a collector of the third switch is connected with the circuit output voltage, and the other of the emitter and the collector of the third switch is connected with the in-phase input end of the error amplifier; one of an emitter and a collector of the fourth switch is connected with the inverted input end of the error amplifier, and the other of the emitter and the collector of the fourth switch is connected with the output end of the error amplifier; and an emitter and a collector of the fifth switch are respectively connected with two ends of the resistor in the compensation network.

Embodiments of the present disclosure further provide a switch control method, including: controlling operating states of an error amplifier and a compensation network by controlling on/off states of switches from a first switch to a fifth switch by a control circuit.

In the above solution, the controlling operating states of the error amplifier and the compensation network by controlling on/off states of switches from the first switch to the fifth switch by the control circuit can include:

controlling the first switch and the second switch to be in a closed state by virtue of a same enable signal, and controlling switches from a third switch to the fifth switch to be in an off state, so as to make the error amplifier operate in an amplification state and make the compensation network operate in a mutual compensation state of resistor and capacitor; and controlling the first switch and the second switch to be in an off state by virtue of the same enable signal, and controlling switches from the third switch to the fifth switch to be in a closed state, so as to make the error amplifier operate in a voltage following state and make the compensation network operate in a capacitance self-compensation state.

Embodiments of the present disclosure further provide a regulator, including the above switch control circuit.

The present disclosure further provides a computer storage medium in which a computer executable instruction is stored; wherein, the computer executable instruction is used for executing the above switch control method.

According to the switch control method, switch control circuit, regulator and computer storage medium provided by embodiments of the present disclosure, operating states of the error amplifier and the compensation network are controlled by controlling on/off states of switches from the first switch to the fifth switch by the control circuit; the error amplifier is enabled to operate in the amplification state and the compensation network is enabled to operate in the mutual compensation state of resistor and capacitor when the first switch and the second switch are in a closed state and switches from the third switch to the fifth switch are in an off state; and the error amplifier is enabled to operate in the voltage following state and the compensation network is enabled to operate in the capacitance self-compensation state when the first switch and the second switch are in an off state and switches from the third switch to the fifth switch are in a closed state. Thus, an output of the error amplifier can be effectively controlled in case of a light load when the BUCK circuit is mutually switched between a PSM mode and a PWM mode due to control of the error amplifier and the compensation network, so that ripples of an circuit output voltage are reduced.

In addition, the compensation network connected to the output end of the error amplifier is controlled in embodiments of the present disclosure, so that stability of the error amplifier and the BUCK circuit can be effectively improved; moreover, in embodiments of the present disclosure, the switch control circuit is simple and convenient in implementation solution and is easy to implement.

BRIEF DESCRIPTION OF DRAWINGS

At least one embodiment is illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

In embodiments of the present disclosure, operating states of the error amplifier and the compensation network are controlled by controlling on/off states of switches from a first switch to a fifth switch by a control circuit.

Specifically, the control circuit controls the first switch and a second switch to be in a closed state by virtue of a same enable signal, and controls switches from a third switch to the fifth switch to be in an off state, so as to make the error amplifier operate in an amplification state, and make the compensation network operate in a mutual compensation state of resistor and capacitor; and, the control circuit controls the first switch and the second switch to be in an off state by virtue of the same enable signal, and controls switches from the third switch to the fifth switch to be in a closed state, so as to make the error amplifier operate in a voltage following state, and make the compensation network operate in a capacitance self-compensation state.

Figure 1:
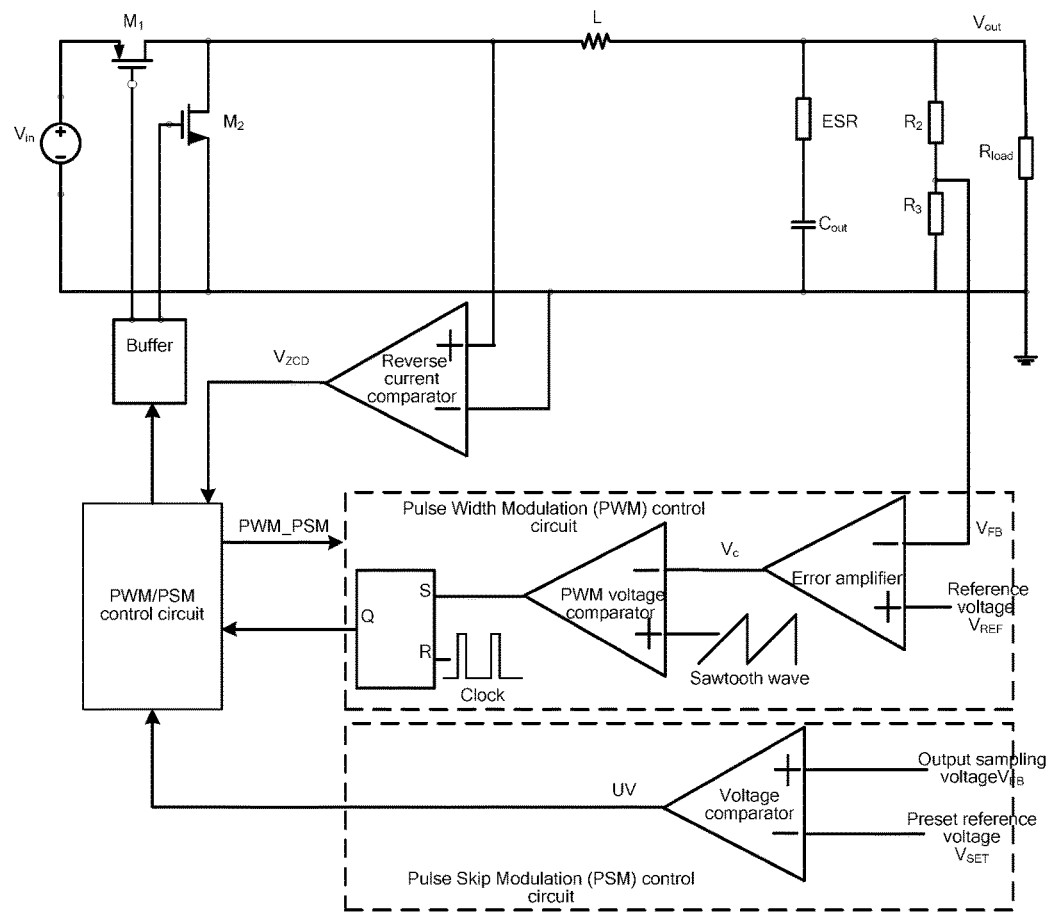
FIG. 1 is a schematic diagram illustrating a composition structure of the BUCK circuit.

The same enable signal here is an enable signal PWM_PSM in a BUCK circuit as shown in FIG. 1.

The present disclosure is further described below in details by combining the drawings and specific embodiments.

Figure 3:
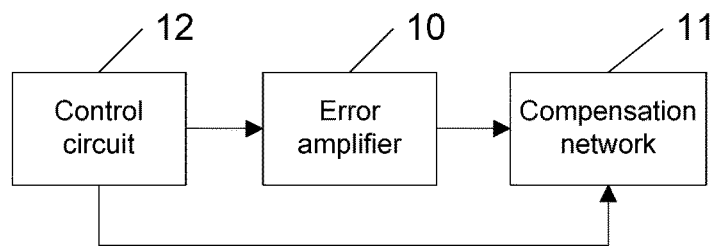
FIG. 3 is a schematic diagram illustrating a composition structure of a switch control circuit in embodiments of the present disclosure.

FIG. 3 is a schematic diagram illustrating a composition structure of a switch control circuit in embodiments of the present disclosure. As shown in FIG. 3, the switch control circuit includes: an error amplifier 10, a compensation network 11 and a control circuit 12; where the compensation network 11 is connected to an output end of the error amplifier 10;

the control circuit 12 includes switches from a first switch to a fifth switch and is configured to control operating states of the error amplifier 10 and the compensation network 11 by controlling on/off states of switches from the first switch to the fifth switch.

The control circuit may control on/off states of switches from the first switch to the fifth switch by virtue of a same enable signal; and the compensation network may include a resistor and a capacitor.

Figure 4:
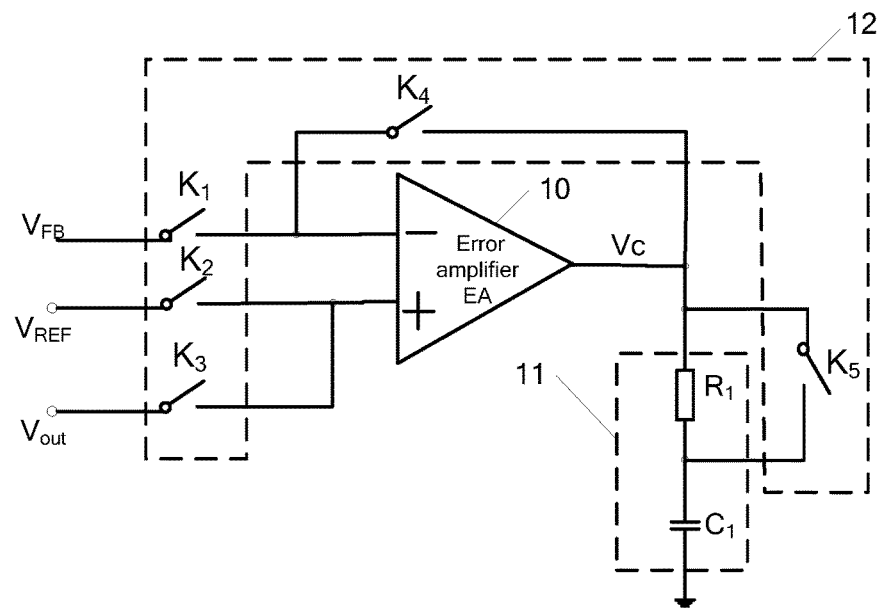
FIG. 4 is a schematic diagram illustrating a composition structure of a switch control circuit in an actual application of embodiments of the present disclosure.

In an actual application, as shown in FIG. 4, the compensation network 11 includes a resistor $R_1$ and a capacitor $C_1$, and the control circuit 12 includes a first switch $k_1$, a second switch $K_2$, a third switch $K_3$, a fourth switch $K_4$ and a fifth switch $K_5$; the control circuit 12 controls on/off states of switches from the first switch $K_1$ to the fifth switch $K_5$ by virtue of a same enable signal, so as to control operating states of the error amplifier (EA) 10 and the compensation network 11.

Specifically, the control circuit 12 controls the first switch $K_1$ and the second switch $K_2$ to be in a closed state by virtue of a same enable signal, and controls the third switch $K_3$, the fourth switch $K_4$ and the fifth switch $K_5$ to be in an off state, so as to make the EA 10 operate in an amplification state, and make the compensation network 11 operate in a mutual compensation state of resistor and capacitor; and, the control circuit 12 controls the first switch $K_1$ and the second switch $K_2$ to be in an off state by virtue of a same enable signal, and controls the third switch $K_3$, the fourth switch $K_4$ and the fifth switch $K_5$ to be in a closed state, so as to make the EA 10 operate in a voltage following state, and make the compensation network 11 operate in a capacitance self-compensation state.

Switches from the first switch $K_1$ to the fifth switch $K_5$ here adopt one of Positive Channel Metal Oxide Semiconductor (PMOS), Negative Channel Metal Oxide Semiconductor (NMOS) and triode.

When switches from the first switch $K_1$ to the fifth switch $K_5$ adopt the PMOS or NMOS, one of a source and a drain of the first switch $K_1$ is connected with an output sampling voltage $V_{FB}$, and the other of the source and the drain of the first switch $K_1$ is connected with an inverted input end of the EA 10; one of a source and a drain of the second switch $K_2$ is connected with a reference voltage $V_{REF}$, and the other of the source and the drain of the second switch $K_2$ is connected with an in-phase input end of the EA 10; one of a source and a drain of the third switch $K_3$ is connected with a circuit output voltage $V_{out}$, and the other of the source and the drain of the third switch $K_3$ is connected with the in-phase input end of the error amplifier 10; one of a source and a drain of the fourth switch $K_4$ is connected with the inverted input end of the EA 10, and the other of the source and the drain of the fourth switch $K_4$ is connected with the output end of the EA 10; and a source and a drain of the fifth switch $K_5$ are respectively connected with two ends of the resistor $R_1$ in the compensation network 11.

When switches from the first switch $K_1$ to the fifth switch $K_5$ adopt the triode, one of an emitter and a collector of the first switch $K_1$ is connected with the output sampling voltage $V_{FB}$, and the other of the emitter and the collector of the first switch $K_1$ is connected with the inverted input end of the EA 10; one of an emitter and a collector of the second switch $K_2$ is connected with the reference voltage $V_{REF}$, and the other of the emitter and the collector of the second switch $K_2$ is connected with the in-phase input end of the EA 10; one of an emitter and a collector of the third switch $K_3$ is connected with the circuit output voltage $V_{out}$, and the other of the emitter and the collector of the third switch $K_3$ is connected with the in-phase input end of the EA 10; one of an emitter and a collector of the fourth switch $K_4$ is connected with the inverted input end of the EA 10, and the other of the emitter and the collector of the fourth switch $K_4$ is connected with the output end of the EA 10; and an emitter and a collector of the fifth switch $K_5$ are respectively connected with two ends of the resistor R1 in the compensation network 11.

Here, it should be noted that, the enable signal can be inverted in a manner of adding a phase inverter with regard to selection of device types adopted by switches from the first switch $K_1$ to the fifth switch $K_4$, so as to ensure that the first switch $K_1$ and the second switch $K_2$ are simultaneously switched on or off, switches from the third switch $K_3$ to the fifth switch $K_5$ are simultaneously switched on or off, and on/off states of the first switch K1 and the second switch $K_2$ are just opposite to on/off states of switches from the third switch $K_3$ to the fifth switch $K_5$.

Thus, in order to improve power-supply efficiency at a light load, the BUCK circuit would be mutually switched between a PWM mode and a PSM mode. An operating state of the EA 10 is different from that of the compensation network 11 in the two different modes.

When the BUCK circuit operates in the PSM mode, the first switch $K_1$ and the second switch $K_2$ are controlled to be switched off by virtue of a same enable signal PWM_PSM, while the third switch $K_3$, the fourth switch $K_4$ and the fifth switch $K_5$ are switched on, so that the error amplifier operates in a closed loop mode, an output voltage $V_c$ of the error amplifier follows change of an input voltage, $V_c=V_{out}$, that is, the error amplifier operates as a unit gain operational amplifier, and an output of the error amplifier follows change of the input voltage. Meanwhile, the compensation network 11 operates in a capacitance self-compensation state, the resistor $R_1$ is short-circuited by the fifth switch $K_5$, at this moment the capacitor $C_1$ serves as a self-compensation capacitor of the error amplifier, and closed loop stability of the error amplifier can be well improved.

When the BUCK circuit is switched into the PWM mode to operate, the first switch $K_1$ and the second switch $K_2$ are controlled to switch on by virtue of the PWM_PSM, while the third switch $K_3$, the fourth switch $K_4$ and the fifth switch $K_5$ are switched off, so that the error amplifier operates in an open-loop mode, a difference between the reference voltage $V_{REF}$ and the output sampling voltage $V_{FB}$ is amplified, and the output voltage $V_c$ is compared with sawtooth waves, so as to achieve an aim of changing switching duty cycle. Meanwhile, the compensation network 11 operates in the mutual compensation state of resistor and capacitor, and a zero point at $1/R_1C_1$ is introduced due to a combined action of the resistor $R_1$ and the capacitor $C_1$, so as to compensate an LC pole of the BUCK circuit, gain a phase margin high enough, so that stability of the whole BUCK circuit is improved.

Embodiments of the present disclosure further provide a switch control method based on the above switch control circuit. The method includes: the control circuit controls operating states of the error amplifier and the compensation network by controlling on/off states of switches from the first switch to the fifth switch.

Specifically, the control circuit controls the first switch and the second switch to be in a closed state by virtue of a same enable signal, and controls the third switch, the fourth switch and the fifth switch to be in an off state, so as to make the error amplifier operate in an amplification state, and make the compensation network operate in a mutual compensation state of resistor and capacitor; and, the control circuit controls the first switch and the second switch to be in an off state by virtue of the same enable signal, and controls the third switch, the fourth switch and the fifth switch to be in a closed state, so as to make the error amplifier operate in a voltage following state, and make the compensation network operate in a capacitance self-compensation state.

Embodiments of the present disclosure further provide a computer storage medium in which a computer executable instruction is stored; the computer executable instruction is used for executing the above switch control method.

Embodiments of the present disclosure further provide a regulator based on the above switch control circuit. The regulator includes a switch control circuit, and specific composition structures of the switch control circuit and functions completed by each composition structure are as same as composition structures and completed functions shown in FIG. 3 and FIG. 4.

Figure 5:
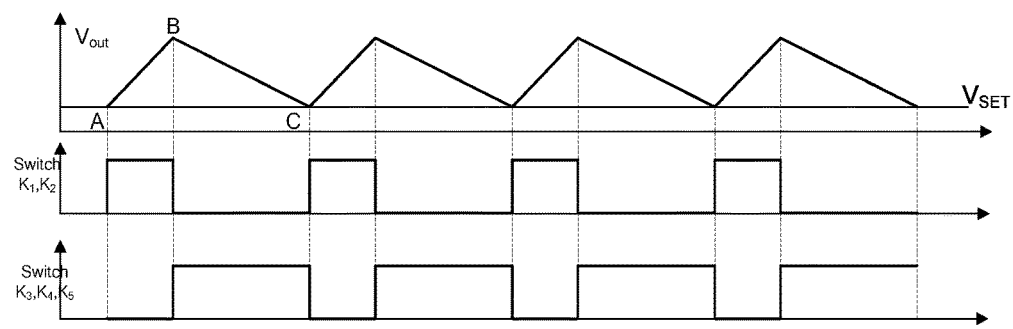
FIG. 5 is a schematic diagram illustrating an oscillogram of a circuit output voltage of a BUCK circuit at a light load and operating conditions of five corresponding switches in embodiments of the present disclosure.

FIG. 5 is a schematic diagram illustrating an oscillogram of a circuit output voltage of a BUCK circuit at a light load and operating conditions of five corresponding switches in embodiments of the present disclosure. When the BUCK circuit is switched into the PWM mode, as shown in FIG. 1 and FIG. 4, inductive current is reduced on a rising section AB of the circuit output voltage $V_{out}$; and when a zero-cross detection circuit detects a zero-cross signal, that is, an output value $V_{ZCD}$ of a reverse current comparator is changed into a high level, the circuit is switched into a PSM operating mode, then the circuit output voltage $V_{out}$ rises to a point B; then, the first switch $K_1$ and the second switch $K_2$ are controlled to be switched off by virtue of an enable signal PWM_PSM, while the third switch $K_3$, the fourth switch $K_4$ and the fifth switch $K_5$ are switched on, so that the in-phase input end of the EA is directly connected with the circuit output voltage $V_{out}$, the inverted input end of the EA is connected with an output end, the error amplifier operates in a closed loop mode, and the output voltage $V_c$ of the error amplifier follows change of the input voltage.

As shown in FIG. 5, on a dropping section BC of the circuit output voltage $V_{out}$, the BUCK circuit operates in the PSM mode, and the error amplifier serving as a unit gain amplifier always follows change of the circuit output voltage. Since the circuit operates in the PSM mode for time long enough, response time of the error amplifier can be completely met. Then, other modules, such as an SR latch, a voltage comparator and the like in the PWM mode are in an off state.

When dropping to a point C, the circuit output voltage $V_{out}$ is compared with a preset reference voltage $V_{SET}$, so as to make a switching tube M1 shown in FIG. 1 switched on, make a switching tube M2 switched off, make current at two ends of an inductor rise, and make the BUCK circuit switch from the PSM mode to the PWM mode for operating. Then, the output voltage $V_c$ of the EA is still equal to the circuit output voltage $V_{out}$. When the circuit is switched to the PWM mode, the first switch $K_1$ and the second switch $K_2$ are controlled to be switched on by virtue of the enable signal PWM_PSM, while the third switch $K_3$, the fourth switch $K_4$ and the fifth switch $K_5$ are switched off, a difference of the output sampling voltage $V_{FB}$ and the reference voltage $V_{REF}$ is amplified by the EA, and an obtained output voltage $V_c$ is compared with sawtooth waves, so as to achieve an aim of changing a duty cycle of the switching tubes.

It should be noted that, assuming that the BUCK circuit is controlled to switch into the PWM mode at a low level by virtue of the PWM_PSM, a reverser needs to be added on a PMOS-type triode or PNP-type triode adopted by the third switch, the fourth switch and the fifth switch under a condition that the PMOS-type triode or PNP-type triode is conducted when being simultaneously adopted by switches from the first switch $K_1$ to the fifth switch $K_5$ on a low level of a same enable signal.

In addition, except for devices adopted by the five switches, any device or combined circuit of which input/output has a switching logic belongs to a protection scope of the present disclosure.

Figure 2:
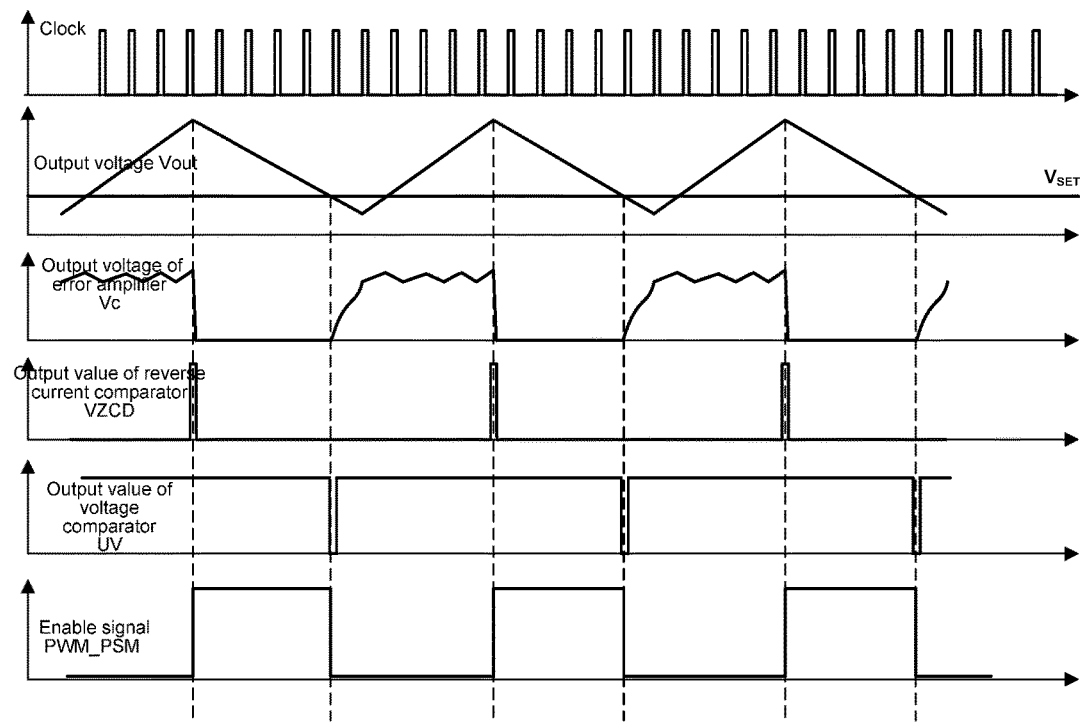
FIG. 2 is an oscillogram illustrating a circuit output voltage and partial operating points of an error amplifier in the existing BUCK circuit during operating.
Figure 6:
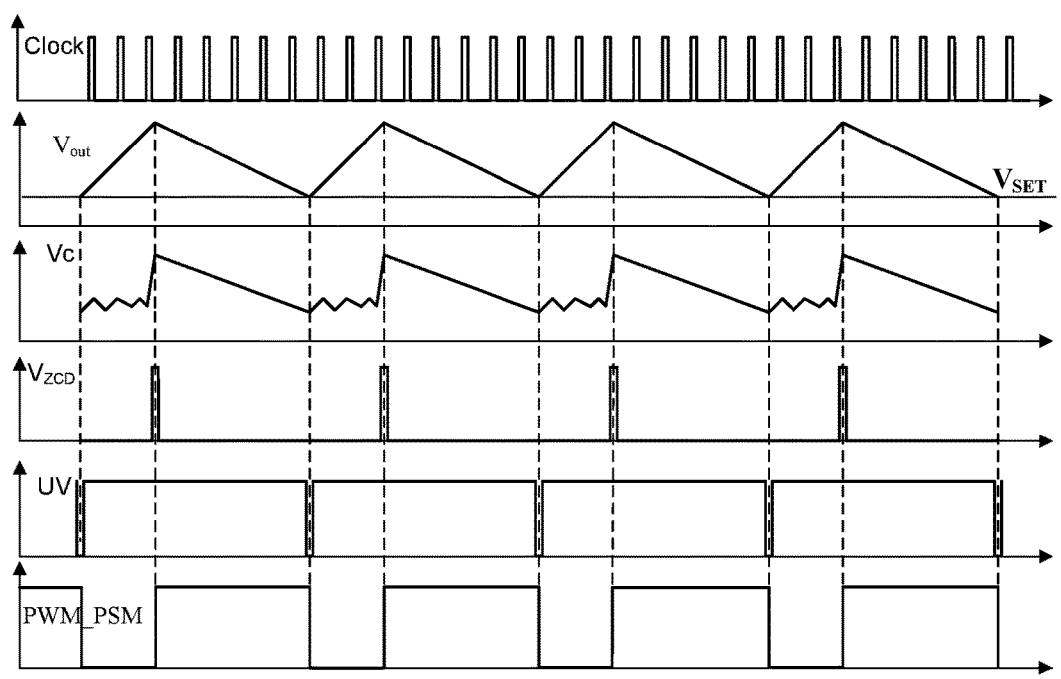
FIG. 6 is an oscillogram illustrating a circuit output voltage and partial operating points of an error amplifier in a BUCK circuit during operating in embodiments of the present disclosure.

FIG. 6 is an oscillogram illustrating a circuit output voltage and partial operating points of the error amplifier in the BUCK circuit during operating in embodiments of the present disclosure. By comparing circuit output voltage waveforms in FIG. 2 and FIG. 6, it should be clear that ripples of the circuit output voltage are well improved.

Those skilled in the art may understand that embodiments of the present disclosure can provide a method, a system or a computer program product. Therefore, the present disclosure can be in the form of a hardware embodiment, a software embodiment or a combination of software and hardware embodiments. Moreover, the present disclosure can be in the form of a computer program product implemented on one or more computer-available storage media (including but not limited to a disk memory, an optical memory and the like) in which computer-available program codes are included.

The present disclosure is described by referring to flow diagrams and/or block diagrams of the methods, devices (systems) and computer program products according to embodiments of the present disclosure. It should be understood that, each flow and/or block in the flow diagrams and/or block diagrams and a combination of flows and/or blocks in the flow diagrams and/or block diagrams can be implemented by computer program instructions. The computer program instructions can be provided for processors of a general-purpose computer, a special-purpose computer, an embedded processor or other programmable data processing devices so as to generate a machine, so that an apparatus used for realizing functions specified in one or more flows in the flow diagrams and/or one or more blocks in the block diagrams is generated by virtue of the instructions executed by the processors of the computers or the other programmable data processing devices.

The computer program instructions can further be stored in a computer readable memory capable of guiding the computers or the other programmable data processing devices to operate in specific manners, so that the instructions stored in the computer readable memory generate manufactures including an instruction apparatus, and the instruction apparatus can realize the functions specified in one or more flows in the flow diagrams and/or one or more blocks in the block diagrams.

The computer program instructions can be further loaded onto the computers or the other programmable data processing devices, so that a series of operating steps are executed on the computers or other programmable devices so as to generate computer implemented processing, and therefore, a step used for realizing the functions specified in one or more flows in the flow diagrams and/or one or more blocks in the block diagrams is provided by the instructions executed on the computers or other programmable devices.

The above descriptions are only embodiments of the present disclosure, but not be used for limiting the protection scope of the present disclosure.

INDUSTRIAL APPLICABILITY

According to the switch control method, switch control circuit, regulator and computer storage medium provided by embodiments of the present disclosure, operating states of the error amplifier and the compensation network are controlled by controlling on/off states of switches from the first switch to the fifth switch by the control circuit; the error amplifier is enabled to operate in the amplification state and the compensation network is enabled to operate in the mutual compensation state of resistor and capacitor when the first switch and the second switch are in a closed state and switches from the third switch to the fifth switch are in an off state; and the error amplifier is enabled to operate in the voltage following state and the compensation network is enabled to operate in the capacitance self-compensation state when the first switch and the second switch are in an off state and switches from the third switch to the fifth switch are in a closed state. Thus, an output of the error amplifier can be effectively controlled in case of a light load when the BUCK circuit is mutually switched between a PSM mode and a PWM mode due to control of the error amplifier and the compensation network, so that ripples of an circuit output voltage are reduced.

What is claimed is:

1. A switch control circuit, comprising an error amplifier, a compensation network and a control circuit; wherein the compensation network is connected to an output end of the error amplifier, and
the control circuit comprises switches from a first switch to a fifth switch and is configured to control operating states of the error amplifier and the compensation network by controlling on/off states of switches from the first switch to the fifth switch,
wherein the control circuit controls on/off states of switches from the first switch to the fifth switch by virtue of a same enable signal; the compensation network comprises a resistor and a capacitor;
the control circuit controls the first switch and a second switch to be in a closed state, and when switches from a third switch to the fifth switch are in an off state, the error amplifier operates in an amplification state, and the compensation network operates in a mutual compensation state of resistor and capacitor; and
the control circuit controls the first switch and the second switch to be in an off state, and when switches from the third switch to the fifth switch are in a closed state, the error amplifier operates in a voltage following state, and the compensation network operates in a capacitance self-compensation state.

2. The switch control circuit according to claim 1, wherein switches from the first switch to the fifth switch adopt one of P-channel Metal Oxide Semiconductor PMOS, N-channel Metal Oxide Semiconductor NMOS and a triode.

3. The switch control circuit according to claim 2, wherein when switches from the first switch to the fifth switch adopt the PMOS or NMOS, one of a source and a drain of the first switch is connected with an output sampling voltage, and the other of the source and the drain of the first switch is connected with an inverted input end of the error amplifier; one of a source and a drain of the second switch is connected with a reference voltage, and the other of the source and the drain of the second switch is connected with an in-phase input end of the error amplifier; one of a source and a drain of the third switch is connected with a circuit output voltage, and the other of the source and the drain of the third switch is connected with the in-phase input end of the error amplifier; one of a source and a drain of the fourth switch is connected with the inverted input end of the error amplifier, and the other of the source and the drain of the fourth switch is connected with the output end of the error amplifier; and a source and a drain of the fifth switch are respectively connected with two ends of a resistor in the compensation network.

4. The switch control circuit according to claim 2, wherein when the first switch to the fifth switch adopt the triode, one of an emitter and a collector of the first switch is connected with the output sampling voltage, and the other of the emitter and the collector of the first switch is connected with the inverted input end of the error amplifier; one of an emitter and a collector of the second switch is connected with the reference voltage, and the other of the emitter and the collector of the second switch is connected with the in-phase input end of the error amplifier; one of an emitter and a collector of the third switch is connected with the circuit output voltage, and the other of the emitter and the collector of the third switch is connected with the in-phase input end of the error amplifier; one of an emitter and a collector of the fourth switch is connected with the inverted input end of the error amplifier, and the other of the emitter and the collector of the fourth switch is connected with the output end of the error amplifier; and an emitter and a collector of the fifth switch are respectively connected with two ends of the resistor in the compensation network.

5. A switch control method comprising:
controlling a first switch and a second switch to be in a closed state by virtue of a same enable signal, and controlling switches from a third switch to a fifth switch to be in an off state, so as to make an error amplifier operate in an amplification state and make a compensation network operate in a mutual compensation state of resistor and capacitor; and
controlling the first switch and the second switch to be in an off state by virtue of the same enable signal, and controlling switches from the third switch to the fifth switch to be in a closed state, so as to make the error amplifier operate in a voltage following state and make the compensation network operate in a capacitance self-compensation state.

6. A regulator, comprising a switch control circuit including an error amplifier, a compensation network and a control circuit; wherein the compensation network is connected to an output end of the error amplifier, and
the control circuit comprises switches from a first switch to a fifth switch and is configured to control operating states of the error amplifier and the compensation network by controlling on/off states of switches from the first switch to the fifth switch;
wherein the control circuit controls on/off states of switches from the first switch to the fifth switch by virtue of a same enable signal; the compensation network comprises a resistor and a capacitor;
the control circuit controls the first switch and a second switch to be in a closed state, and when switches from a third switch to the fifth switch are in an off state, the error amplifier operates in an amplification state, and the compensation network operates in a mutual compensation state of resistor and capacitor; and
the control circuit controls the first switch and the second switch to be in an off state, and when switches from the third switch to the fifth switch are in a closed state, the error amplifier operates in a voltage following state, and the compensation network operates in a capacitance self-compensation state.

7. The regulator according to claim 6, wherein switches from the first switch to the fifth switch adopt one of P-channel Metal Oxide Semiconductor PMOS, N-channel Metal Oxide Semiconductor NMOS and a triode.

8. The regulator according to claim 7, wherein when switches from the first switch to the fifth switch adopt the PMOS or NMOS, one of a source and a drain of the first switch is connected with an output sampling voltage, and the other of the source and the drain of the first switch is connected with an inverted input end of the error amplifier; one of a source and a drain of the second switch is connected with a reference voltage, and the other of the source and the drain of the second switch is connected with an in-phase input end of the error amplifier; one of a source and a drain of the third switch is connected with a circuit output voltage, and the other of the source and the drain of the third switch is connected with the in-phase input end of the error amplifier; one of a source and a drain of the fourth switch is connected with the inverted input end of the error amplifier, and the other of the source and the drain of the fourth switch is connected with the output end of the error amplifier; and a source and a drain of the fifth switch are respectively connected with two ends of a resistor in the compensation network.

9. The regulator according to claim 7, wherein when the first switch to the fifth switch adopt the triode, one of an emitter and a collector of the first switch is connected with the output sampling voltage, and the other of the emitter and the collector of the first switch is connected with the inverted input end of the error amplifier; one of an emitter and a collector of the second switch is connected with the reference voltage, and the other of the emitter and the collector of the second switch is connected with the in-phase input end of the error amplifier; one of an emitter and a collector of the third switch is connected with the circuit output voltage, and the other of the emitter and the collector of the third switch is connected with the in-phase input end of the error amplifier; one of an emitter and a collector of the fourth switch is connected with the inverted input end of the error amplifier, and the other of the emitter and the collector of the fourth switch is connected with the output end of the error amplifier; and an emitter and a collector of the fifth switch are respectively connected with two ends of the resistor in the compensation network.

10. A computer storage medium in which a computer executable instruction is stored, the computer executable instruction is used for executing:

controlling a first switch and a second switch to be in a closed state by virtue of a same enable signal, and controlling switches from a third switch to a fifth switch to be in an off state, so as to make an error amplifier operate in an amplification state and make a compensation network operate in a mutual compensation state of resistor and capacitor; and controlling the first switch and the second switch to be in an off state by virtue of the same enable signal, and controlling switches from the third switch to the fifth switch to be in a closed state, so as to make the error amplifier operate in a voltage following state and make the compensation network operate in a capacitance self-compensation state.

* * * * *